United States Patent
Datta et al.

(10) Patent No.: US 9,083,325 B2
(45) Date of Patent: Jul. 14, 2015

(54) LOW OVERHEAD HOLD-VIOLATION FIXING SOLUTION USING METAL-PROGRAMABLE CELLS

(71) Applicant: QUALCOMM Incorporated, San Diego, CA (US)

(72) Inventors: Animesh Datta, San Diego, CA (US); Qi Ye, San Diego, CA (US); Chih-Lung Kao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 95 days.

(21) Appl. No.: 13/918,670

(22) Filed: Jun. 14, 2013

(65) Prior Publication Data
US 2014/0368247 A1 Dec. 18, 2014

(51) Int. Cl.
G06F 7/38 (2006.01)
G05B 19/045 (2006.01)
H03K 3/037 (2006.01)
H03K 3/29 (2006.01)

(52) U.S. Cl.
CPC ............ *H03K 3/0375* (2013.01); *G05B 19/045* (2013.01); *H03K 3/037* (2013.01); *H03K 3/29* (2013.01)

(58) Field of Classification Search
CPC ........ G05B 19/045; G06F 7/00; H03K 3/037; H03K 3/29; H03K 3/04; H03K 3/2893
USPC .............................. 326/46; 327/185, 201–218
See application file for complete search history.

(56) References Cited

U.S. PATENT DOCUMENTS

| | | | |
|---|---|---|---|
| 5,841,296 A | 11/1998 | Churcher et al. | |
| 6,060,930 A * | 5/2000 | Choi | 327/276 |
| 6,310,506 B1 * | 10/2001 | Brown | 327/284 |
| 6,397,374 B1 * | 5/2002 | Pasqualini | 326/49 |
| 6,507,232 B2 * | 1/2003 | Matsui | 327/337 |
| 6,902,957 B2 * | 6/2005 | Wang et al. | 438/128 |
| 8,601,427 B2 * | 12/2013 | Kawagoe | 716/134 |
| 2005/0068080 A1 | 3/2005 | Lee | |
| 2008/0143383 A1 * | 6/2008 | Wong | 326/46 |
| 2012/0200330 A1 | 8/2012 | Kawagoe | |
| 2014/0197463 A1 * | 7/2014 | Gan et al. | 257/204 |

* cited by examiner

*Primary Examiner* — Dylan White
(74) *Attorney, Agent, or Firm* — Novak Druce Connolly Bove + Quigg LLP (57) ABSTRACT

Techniques for fixing hold violations using metal-programmable cells are described herein. In one embodiment, a system comprises a first flip-flop, a second flip-flop, and a data path between the first and second flip-flops. The system further comprises a metal-programmable cell connected to the data path, wherein the metal-programmable cell is programmed to implement at least one capacitor to add a capacitive load to the data path. The capacitive load adds delay to the data path that prevents a hold violation at one of the first and second flip-flops.

13 Claims, 7 Drawing Sheets

LOW OVERHEAD HOLD-VIOLATION FIXING SOLUTION USING METAL-PROGRAMABLE CELLS

BACKGROUND

1. Field

Aspects of the present disclosure relate generally to fixing hold violations, and more particularly, to fixing hold violations using metal-programmable cells.

2. Background

Flip-flops (e.g., D flip-flops) are commonly used in integrated circuits to capture data values from a data signal on active edges of an input clock signal. The active edges may be rising clock edges for a positive-edge triggered flip-flop or falling clock edges for a negative-edge triggered flip-flop.

In order for a flip-flop to properly capture a data value from the data signal, the data value needs to be stable at the input of the flip-flop for a time period before an active edge of the clock signal (referred to as setup time), and for a time period after the active edge of the clock signal (referred to as hold time). A hold violation occurs when the data value at the input of the flip-flop changes during the hold time of an active edge of the clock signal. The hold violation may be fixed by adding a delay to the data signal so that the data value at the input of the flip-flop changes outside the hold time of the active edge of the clock signal. Typically, the delay is added by inserting one or more buffers into a data path that routes the data signal to the input of the flip-flop.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to an aspect, a system is described herein. The system comprises a first flip-flop, a second flip-flop, and a data path between the first and second flip-flops. The system further comprises a metal-programmable cell connected to the data path, wherein the metal-programmable cell is programmed to implement at least one capacitor to add a capacitive load to the data path.

A second aspect relates to a method for delaying a signal. The method comprises sending the signal from a first flip-flop to a second flip-flop along a data path between the first and second flip-flops. The method also comprises delaying the signal on the data path by a predetermined amount using a metal-programmable cell, wherein the metal-programmable cell is programmed to implement at least one capacitor, and the at least one capacitor adds a capacitive load to the data path that delays the signal by the predetermined amount.

A third aspect relates to an apparatus for delaying a signal. The apparatus comprises means for sending the signal from a first flip-flop to a second flip-flop along a data path between the first and second flip-flops. The apparatus also comprises means for delaying the signal on the data path by a predetermined amount by adding a capacitive load to the data path that delays the signal by the predetermined amount.

A fourth aspect relates to a method for fixing a hold violation at a flip-flop. The method comprises determining an amount of delay needed on a data path to fix the hold violation, and determining a capacitive load based on the determined amount of delay. The method also comprises programming a metal-programmable cell to implement at least one capacitor to provide the determined capacitive load, and connecting the metal-programmable cell to the data path.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
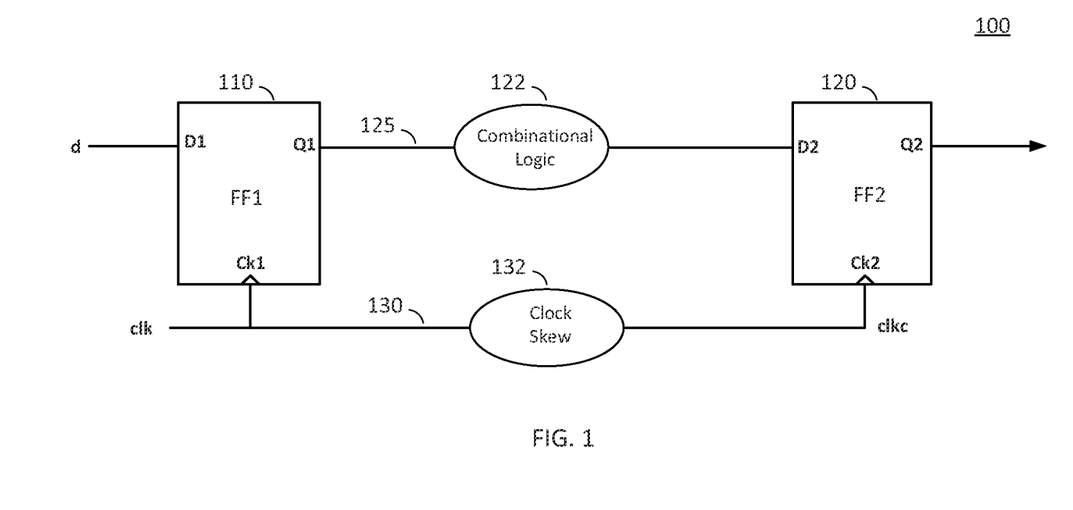
FIG. 1 shows an example of a system comprising two flip-flops.

FIG. 1 shows a system 100 comprising a first flip-flop 110 and a second flip-flop 120. The first flip-flop 110 captures data values of a data signal d at its input D1 on the active edges of a clock signal clk, and outputs the captured data values at its output Q1. The active edges may be the rising edges of the clock signal clk if the first flip-flop 110 is a positive-edge triggered flip-flop or the falling edges of the clock signal clock if the first flip-flop 110 is a negative-edge triggered flip-flop. The captured data values propagate to the second flip-flop 120 via a data path 125. The data path 125 may include combinational logic 122 that delays the data values.

The clock clk propagates to the second flip-flop 120 via a clock path 130 that skews the clock clk, resulting in a skewed clock signal clkc at the second flip-flop 120. This is represented by clock skew 132 in FIG. 1. The second flip-flop 120 captures data values at its input D2 on the active edges of the skewed clock signal clkc, and outputs the captured data values at its output Q2.

In order for the second flip-flop 120 to properly capture a data value from the first flip-flop 110 at its input D2, the data value needs to be stable for a time period before an active edge of the skewed clock signal clkc (referred to as setup time), and for a time period after the active edge of the skewed clock signal clkc (referred to as hold time). A hold violation occurs when the data value at the input D2 changes during the hold time of an active clock edge. The hold violation may be fixed by delaying the data signal along the data path 125 so that the data value at the input D2 changes outside the hold time of the active clock edge.

A hold violation may be prevented by meeting the following condition:

$$t_{clock\text{-}to\text{-}Q} + t_{data\text{-}delay} \geq t_{skew} + t_{hold}$$

where $t_{clock\text{-}to\text{-}Q}$ is the delay from an active edge of the clock signal clk to the output Q1 of the first flip-flop 110, $t_{data\text{-}delay}$ is the delay along the data path 125, $t_{skew}$ is the clock skew, and $t_{hold}$ is the hold time. As can be seen from the above condition, a hold-violation occurs when $t_{clock\text{-}to\text{-}Q} + t_{data\text{-}delay}$ is smaller than $t_{skew} + t_{hold}$. In this case, the hold violation may be fixed by increasing the delay along the data path (i.e., $t_{data\text{-}delay}$) to meet the above condition.

The conventional technique for fixing a hold violation is to insert one or more buffers into the data path 125 to increase the delay along the data path 125. Adding a buffer requires routing resources to connect both the input and the output of the buffer to the data path in order to reroute the data path through the buffer. Also, on a densely-populated chip, it may be difficult to find available space for inserting the buffer and/or rerouting the data path through the buffer. Further, the buffer introduces leakage current, which increases power consumption.

Another drawback is that the delay of the buffer may lack fine granularity. For example, the delay of the buffer may lack granularity below 20 ps. This is because the buffer may be implemented using high threshold-voltage transistors (which increase delay) to reduce leakage current. However, a hold violation may only require a much smaller delay (e.g., 5 ps) to fix. Thus, the buffer provides a much larger delay than necessary to fix the hold violation. This is undesirable because delaying the data values too much may potential cause a setup violation. Yet another drawback is that inserting buffers to fix hold violations can introduce new hold violations due to the nature of rerouting, and the design will need to be refined over a few more iterations to converge to a design with no hold violations.

To address the above drawbacks associated with buffers, embodiments of present disclosure add delay to a data path to fix a hold violation by adding a capacitive load to the data path using a metal-programmable cell. The capacitive load reduces routing overhead, reduces leakage current, and provides a delay with finer granularity, as discussed further below.

Figure 2:
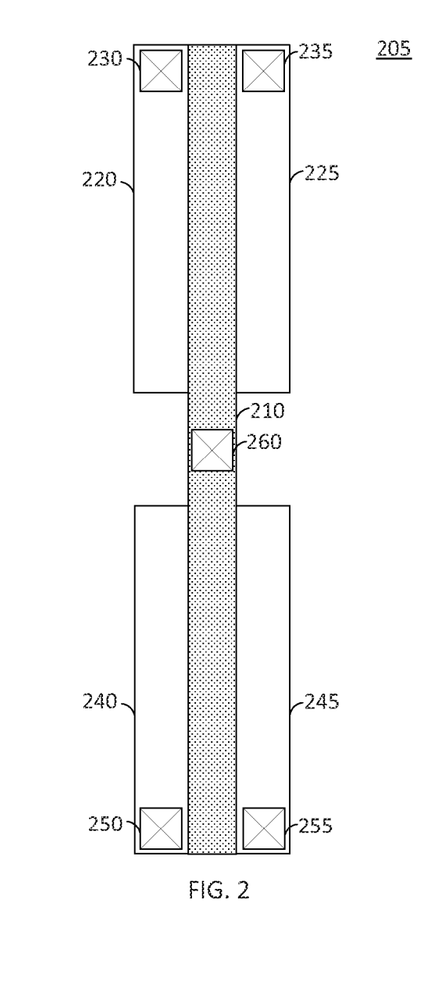
FIG. 2 shows a top-down view of an exemplary metal-programmable cell.

FIG. 2 shows a top-down view of an exemplary metal-programmable cell 205. The cell 205 comprises a gate 210, a first source/drain region 220, a second source/drain region 225, a third source/drain region 240, and a fourth source/drain region 245. The first and second source/drain regions 220 and 225 may comprise P+ regions in a substrate (e.g., P+ regions diffused and/or implanted in an N well in the substrate). The third and fourth source/drain regions 240 and 245 may comprise N+ regions in the substrate (e.g., N+ regions diffused and/or implanted in a P well in the substrate). The gate 210 may comprise a metal, polysilicon or a combination thereof.

The cell 205 also comprises a first via 230 connected to the first source/drain region 220, a second via 235 connected to the second source/drain region 225, a third via 250 connected to the third source/drain region 240, a fourth via 255 connected to the fourth source/drain region 245, and a fifth via 260 connected to the gate 210. Each via may be directly connected to the corresponding structure or connected to the corresponding structure through one or more intervening contact layers. The vias extend perpendicularly with respect to FIG. 2. As discussed further below, the vias can be used to connect the corresponding structures to an upper metal layer (e.g., metal layer M1 of the back end of line (BEOL)).

The cell 205 can be programmed to implement a desired logic function by adding an upper metal layer that is patterned to connect the source/drain regions 220, 225, 240 and 245 and the gate 210 in a configuration that implements the desired logic function (hence the term "metal-programmable"). Each of the source/drain regions 220, 225, 240 and 245 and the gate 210 may be connected to the upper metal layer by the respective via. Further, each of the source/drain regions may implement a source or a drain depending on how the gate 210 and the source/drain regions 220, 225, 240 and 245 are connected by the upper metal layer.

For example, the cell 205 may be programmed to implement an inverter (not shown) by patterning the upper metal layer to connect the first source/drain region 220 to Vdd of a power supply, connect the second source/drain region 225 to the fourth source/drain region 245, and connect the third source/drain region 240 to Vss of the power supply. In this example, the inverter comprises an NMOS transistor and a PMOS transistor, in which the first source/drain region 220 forms the source of the PMOS transistor, the second source/drain region 225 forms the drain of the PMOS transistor, the fourth source/drain region 245 forms the drain of the NMOS transistor, and the third source/drain region 240 forms the source of the NMOS transistor. The gate 210 forms the gates of both the PMOS transistor and NMOS transistor, which is connected to the input of the inverter. The output of the inverter is connected to the drains of the PMOS transistor and the NMOS transistor. The metal-programmable cell may be programmed to perform other logic functions.

FIG. 2 shows the baseline structure of the metal-programmable cell 205 before the cell is programmed with an upper metal layer. Although the cell 205 in this example comprises one gate 210 and four source/drain regions, it is to be appreciated that a metal-programmable cell may comprise any number of gates and source/drain regions. Also, it is to be appreciated that the cell 205 may comprise two separate gates in which one of the gates is between the first and second source/drain regions 220 and 225, and the other gate is between the third and fourth source/drain regions 240 and 245. In this example, each of the gates may have a separate via for independently connecting to the gates.

Metal-programmable cells may be distributed throughout a chip to provide the ability to program logic functions into the chip as needed by changing the pattern of the upper metal layer. By distributing the metal-programmable cells throughout the chip, metal-programmable cells are available in different parts of the chip to implement design changes in different parts of the chip. For example, during initial chip layout, metal-programmable cells may be distributed throughout a chip to accommodate design changes (e.g., during an engineering change order (ECO) stage) after initial placement of circuit components and metal routing between the circuit components.

After initial chip layout, a design change requiring additional logic functions may be implemented by programming one or more of the metal-programmable cells to perform the additional logic functions. This may be done by changing the mask (e.g., lithographic mask) used to pattern the upper metal layer during fabrication such that the upper metal layer is patterned to program the metal-programmable cells. The baseline structures of the metal-programmable cells do not need to be changed, thereby reducing development costs and delays associated with the design change. The metal-programmable cells may also be referred to as filler cells.

In one embodiment, a metal-programmable cell is programmed to implement one or more capacitors by adding an upper layer that is patterned to configure the cell into the one or more capacitors. The one or more capacitors may be connected to a data path between two flip-flops to add delay to the data path to fix a hold violation, as discussed further below.

Figure 3:
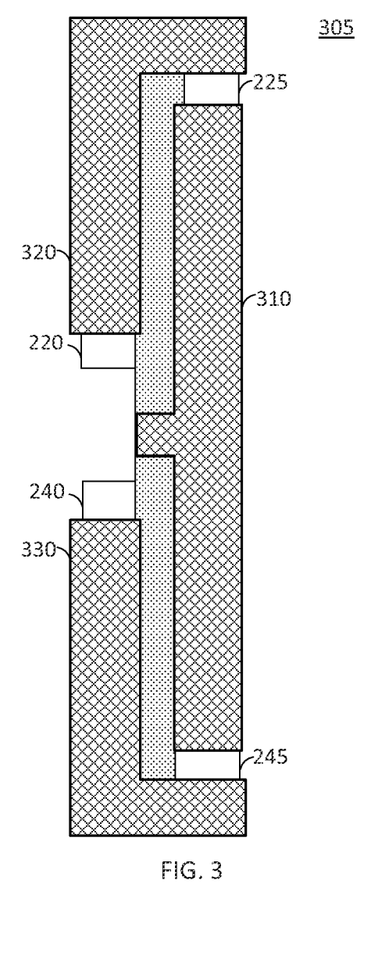
FIG. 3 shows an example of the metal-programmable cell in FIG. 2 programmed to implement two capacitors according to an embodiment of the present disclosure.

FIG. 3 shows an example in which the metal-programmable cell 205 in FIG. 2 is programmed to implement two capacitors by adding an upper metal layer. In this example, the upper metal layer is patterned to form a first metal plate 310, a second metal plate 320, and a third metal plate 330. The second metal plate 320 may be connected to Vdd of a power supply, and the third metal plate 330 may be connected to Vss of the power supply, which may be ground. The first metal plate 310 may be connected to the gate 210 by the fifth via 260, the second plate 320 may be connected to the first and second source/drain regions 220 and 225 by the first and second vias 230 and 235, and the third metal plate 330 may be connected to the third and fourth source/drain regions 240 and 245 by the third and fourth vias 250 and 255. The metal plates 310, 320 and 330 are positioned above the gate 210 and the source/drain regions 220, 225, 240 and 245 with an intervening insulating material (not shown). The metal plates 310, 320 and 330 make electrical contact with the gate 210 and the source/drain regions 220, 225, 240 and 245 through the intervening insulating material using the vias.

Figure 4:
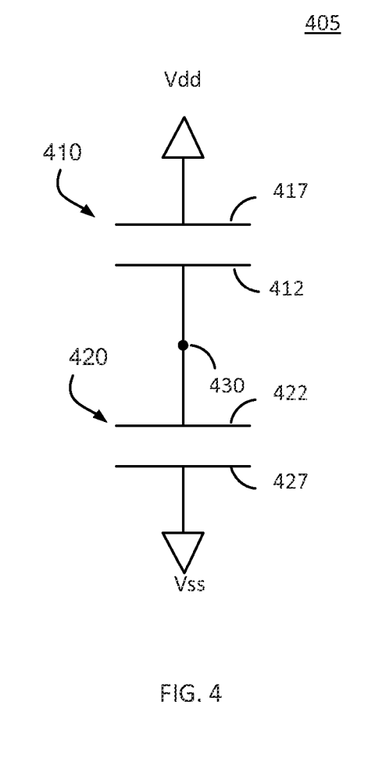
FIG. 4 shows an equivalent circuit of the capacitors implemented by the metal-programmable cell shown in FIG. 3.

FIG. 4 shows an equivalent circuit 405 of the two capacitors implemented by the programmed cell 305. The circuit 405 comprises a first capacitor 410 formed by the first and second metal plates 310 and 320. The first capacitor 410 has a first terminal 412 connected to node 430 and a second terminal 417 connected to Vdd, in which the first terminal 412 corresponds to the first metal plate 310 and the second terminal 417 corresponds to the second metal plate 320. The capacitance of the first capacitor 410 includes the capacitance between the first and second metal plates 310 and 320.

Figure 5A:
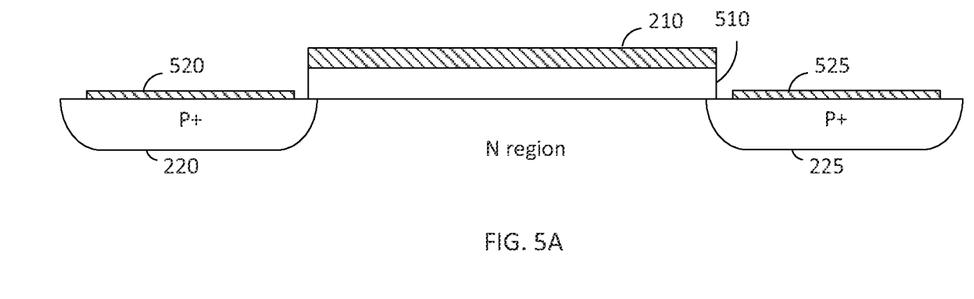
FIG. 5A shows a cross-sectional view of an exemplary metal-programmable cell.

The capacitance of the first capacitor 410 may also include contributions from gate-oxide capacitance and other capacitances in the cell 305. In this regard, FIG. 5A shows an example of a cross-sectional view of the gate 210, the first source/drain region 220 and the second source/drain region 225. In this example, the first source/drain region 220 comprises a first P+ region and the second source/drain region 225 comprises a second P+ region. The first and second P+ regions may be formed in an N-type region (e.g., an N well), as shown in FIG. 5A. To enhance electrical contact between the first P+ region of the first source/drain region 220 and the first via 230 (not shown in FIG. 5A), a first contact layer 520 (not shown in FIG. 2) may be placed over the first P+ region. The first contact layer 520 may comprise a conductive material and may extend the length of the P+ region. In this example, the first via 230 is connected to the P+ region though the contact layer 520. Similarly, a second contact layer 525 (not shown in FIG. 2) may be placed over the second P+ region of the second source/drain region 225 to enhance electrical contact between the second P+ region and the second via 235. The gate 210 is above a portion of the N region between the first and second P+ regions with an oxide layer 510 disposed between the gate 210 and the N region. The portion of the N region between the first and second P+ regions may be referred to as a channel region.

Figure 5B:
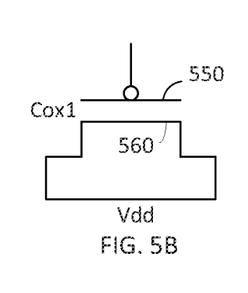
FIG. 5B shows a circuit representation of a gate-oxide capacitor formed by the metal-programmable cell shown in FIG. 5A.

In this example, the oxide layer 510 between the gate 210 and the N region forms a first gate-oxide capacitor Cox1. A circuit representation of the first gate-oxide capacitor Cox1 is shown in FIG. 5B. The gate-oxide capacitance is a function of the dielectric constant of the oxide layer 510, the thickness of the oxide layer 510 and the area of the gate 210 overlapping the oxide layer 510. The first gate-oxide capacitor Cox1 may be coupled to the P+ regions of the first and second source/drain regions 220 and 225 by an accumulation layer or an inversion layer (not shown) formed in the N region underneath the oxide layer 510. The structure shown in FIG. 5A may include additional capacitances, including, for example, a depletion capacitance due to a deletion layer in the N region, capacitance between the gate 210 and the first source/drain region 220, and capacitance between the gate 210 and the second source/drain region 225.

In this example, the first gate-oxide capacitor Cox1 is connected between the first and second metal layers by vias 230, 235 and 260. More particular, the first metal layer 310 is connected to the gate 210 by the fifth via 260, in which the gate 210 forms a first terminal 550 of the first gate-oxide capacitor Cox1 (shown in FIG. 5B). The second metal layer 320 is connected to a second terminal 560 (shown in FIG. 5B) of the first gate-oxide capacitor Cox1 by the first and second vias 230 and 235 and the first and second source/gate regions 220 and 225. The second metal layer 320 connects the second terminal 560 of the first gate-oxide capacitor Cox1 to Vdd, as shown in FIG. 5B. As a result, the capacitance of the first capacitor 410 includes both the capacitance between the first and second metal plates 310 and 320 and the capacitance of the first gate-oxide capacitor Cox1. The capacitance of the first capacitor 410 may also include one or more of the other capacitances mentioned above.

Referring back to FIG. 4, the circuit 405 also comprises a second capacitor 420 formed by the first and third metal plates 310 and 330. The second capacitor 420 has a first terminal 422 connected to node 430 and a second terminal 427 connected to Vss, in which the first terminal 422 corresponds to the first metal plate 310 and the second terminal 427 corresponds to the third metal plate 330. The capacitance of the second capacitor 420 includes the capacitance between the first and third metal plates 310 and 330.

Figure 6A:
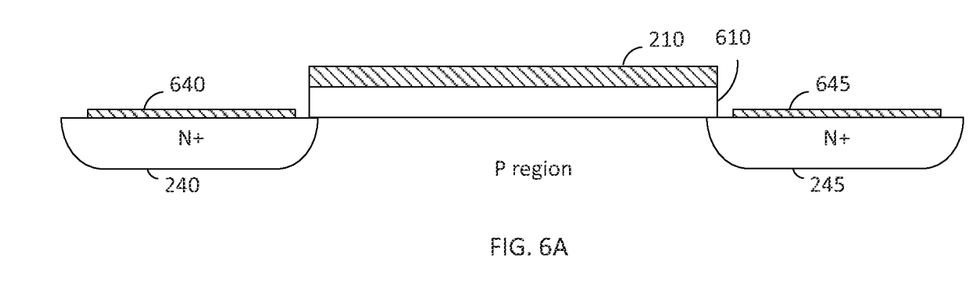
FIG. 6A shows another cross-sectional view of an exemplary metal-programmable cell.

The capacitance of the second first capacitor 420 may also include contributions from gate-oxide capacitance and other capacitances in the cell 305. In this regard, FIG. 6A shows an example of a cross-sectional view of the gate 210, the third source/drain region 240 and the fourth source/drain region 245. In this example, the third source/drain region 240 comprises a first N+ region and the fourth source/drain region 245 comprises a second N+ region. The first and second N+ regions may be formed in a P-type region (e.g., a P well), as shown in FIG. 6A. To enhance electrical contact between the first N+ region of the third source/drain region 240 and the third via 250 (not shown in FIG. 6A), a third contact layer 640 (not shown in FIG. 2) may be placed over the first N+ region. Similarly, a fourth contact layer 645 may be placed over the second N+ region of the fourth source/drain region 245 to enhance electrical contact between the second N+ region and the fourth via 255. The gate 210 is above a portion of the P region between the first and second N+ regions with an oxide layer 610 disposed between the gate 210 and the P region. The portion of the P region between the first and second N+ regions may be referred to as a channel region.

Figure 6B:
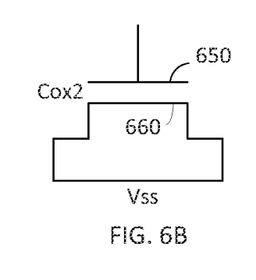
FIG. 6B shows a circuit representation of a gate-oxide capacitor formed by the metal-programmable cell shown in FIG. 6A.

In this example, the oxide layer 610 between the gate 210 and the P region forms a second gate-oxide capacitor Cox2. A circuit representation of the second gate-oxide capacitor Cox2 is shown in FIG. 6B. The second gate-oxide capacitor Cox2 may be coupled to the N+ regions of the third and fourth source/drain regions 240 and 245 by an accumulation layer or an inversion layer (not shown) formed in the P region underneath the oxide layer 610. The structure shown in FIG. 6A may include additional capacitances, including, for example, a depletion capacitance due to a deletion layer in the P region, capacitance between the gate 210 and the third source/drain region 240, and capacitance between the gate 210 and the fourth source/drain region 245.

In this example, the second gate-oxide capacitor Cox2 is connected between the first and third metal layers 310 and 330 by vias 250, 255 and 260. More particular, the first metal layer 310 is connected to the gate 210 by the fifth via 260, which forms a first terminal 650 of the second gate-oxide capacitor Cox2 (shown in FIG. 6B). The third metal layer 330 is connected to a second terminal 660 (shown in FIG. 6B) of the second gate-oxide capacitor Cox2 by the third and fourth vias 250 and 255 and the third and fourth source/gate regions 240 and 245. The third metal layer 330 connects the second terminal 660 of the second gate-oxide capacitor Cox2 to Vss, as shown in FIG. 6B. Therefore, the capacitance of the second capacitor 420 may include both the capacitance between the first and third metal plates 310 and 330 and the capacitance of the second gate-oxide capacitor Cox2. The capacitance of the second capacitor 420 may also include one or more of the other capacitances mentioned above.

The capacitors 410 and 420 may be connected to a data path at node 430 to provide a capacitive load to the data path. Node 430 may correspond to any portion of the first plate 310 (e.g., a portion of the first plate 310 in the vicinity of the fifth via 260 to the gate 210).

Figure 7:
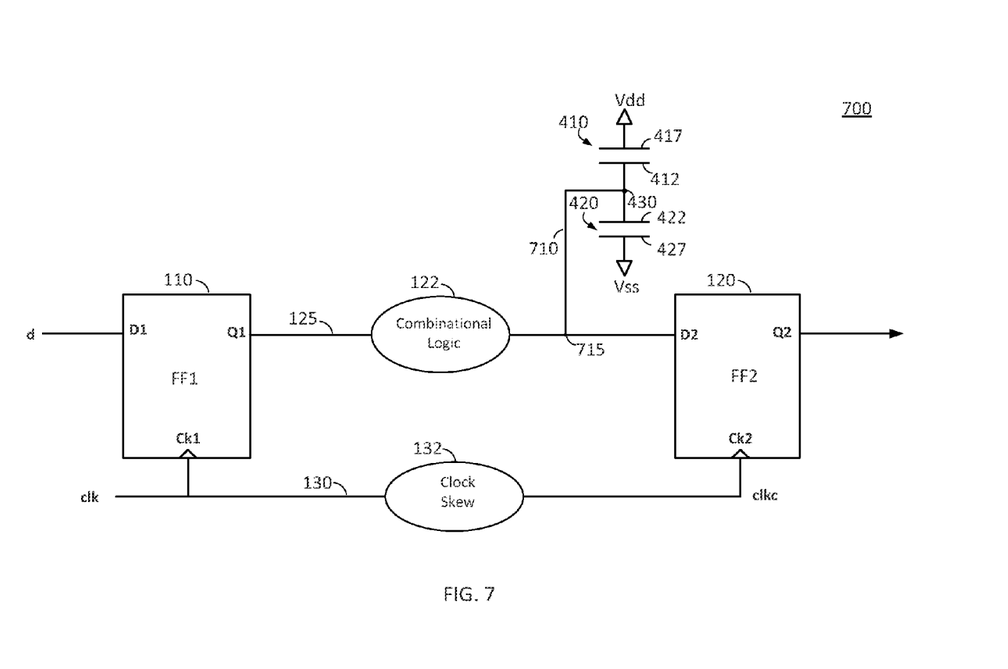
FIG. 7 shows an example of a capacitive load connected to a data path according to an embodiment of the present disclosure.

FIG. 7 shows an example of a system 700 in which the capacitors 410 and 420 implemented by the programmed cell 305 are connected to the data path 125 to fix a hold violation. The capacitances of the capacitors 410 and 420 may be adjusted to achieve a desired capacitive load on the data path 125, and hence a desired delay to fix the hold violation. For example, the capacitances of the capacitors 410 and 420 may be adjusted by adjusting the shapes of the metal plates 310, 320 and 330 and/or the spacing between the metal plates 310, 320 and 330. The shapes of the metal plates 310, 320 and 330 and/or the spacing between the metal plates 310, 320 and 330 may be adjusted by changing a mask used to pattern the upper metal layer. This does not require changing the masks for the baseline structure of the cell 305, which may not change.

The capacitors 410 and 420 require less routing resources than a buffer. This is because the data path 125 does not need to be broken to insert the capacitors 410 and 420 into the data path 125. The capacitors 410 and 420 can be connected to the existing data path 125 by a metal interconnect 710 to add capacitive load, and hence delay, to the data path 125. The metal interconnect 710 may be connected to the data path 125 at any point 715 along the data path 125. Thus, the data path between the flip-flops 110 and 120 may not need to be rerouted to connect the capacitors 410 and 420 to the data path 125.

Also, the capacitors 410 and 420 have little to no leakage compared to a buffer. Further, the delays of the capacitors 410 and 420 have finer granularity than a buffer. This is because the shapes of the metal plates 310, 320 and 330 and/or the spacing between the metal plates 310, 320 and 330 can be precisely adjusted to achieve a desired capacitive load, and hence delay.

Further, programming the cell 205 to implement the capacitors 410 and 420 may eliminate the need of having to find additional space on the chip for the capacitors after the initial chip layout. This is because the initially chip layout may already include the cell 205 as a spare cell (filler cell) that is available for implementing a design change. Further, distributing metal-programmable cells throughout the chip increases the likelihood that there will be at least one available metal-programmable cell in the vicinity of the data path for implementing the capacitors. This reduces the amount of metal routing required to connect the capacitors to the data path.

Although the cell 305 in the example in FIG. 3 is programmed to implement two capacitors, it is to be appreciated that a metal-programmable cell may be programmed to implement any number of capacitors. For example, the cell 305 may be programmed with only the first and third metal plates 310 and 330 to form capacitor 420. Further, although the capacitance of the first capacitor 410 includes both gate-oxide capacitance and the capacitance between the first and second metal layers 310 and 320, the first capacitor 410 may be configured to not include the gate-oxide capacitance. This may be done, for example, by shaping the metal layers 310 and 320 so that they do not overlap the vias 230, 235 and 260, and therefore do not connect to the gate 210 and the first and second source/drain regions 220 and 225.

Figure 8:
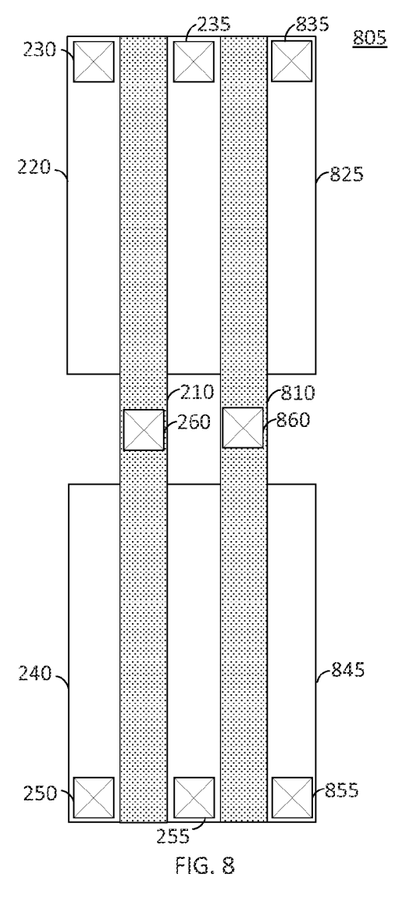
FIG. 8 shows a top-down view of another exemplary metal-programmable cell.

FIG. 8 shows a top-down view of a three-grid metal-programmable cell 805. The cell 805 is similar to the one shown in FIG. 2, and further comprises a second gate 810, a fifth source/drain region 825, and a sixth source/drain region 845. The fifth source/drain region 825 may comprise a P+ region and the sixth source/drain region 845 may comprise an N+ region. The cell 805 also comprises a sixth via 835 connected to the fifth source/drain region 825, a seventh via 855 connected to the sixth source/drain region 845, and an eighth via 860 connected to the second gate 810. Similar to the cell 205 shown in FIG. 2, the cell 805 can be programmed to implement a desired logic function by adding an upper metal layer that is patterned to connect the source/drain regions 220, 225, 240, 245, 825 and 845 and the gates 210 and 810 in a configuration that implements the desired logic function (e.g., inverter, NAND gate, NOR gate, XOR gate, etc.).

FIG. 8 shows the baseline structure of the metal-programmable cell 805 before the cell is programmed with an upper metal layer. Although the second gate 810 is shown as one continuous gate in the example in FIG. 8, it is to be appreciated that the gate 810 may be separated into two gates in which one of the gates is between the second and fifth source/drain regions 225 and 825, and the other gate is between the fourth and sixth source/drain regions 245 and 845. In this example, each of the gates may have a separate via for independently connecting to the gates.

Figure 9A:
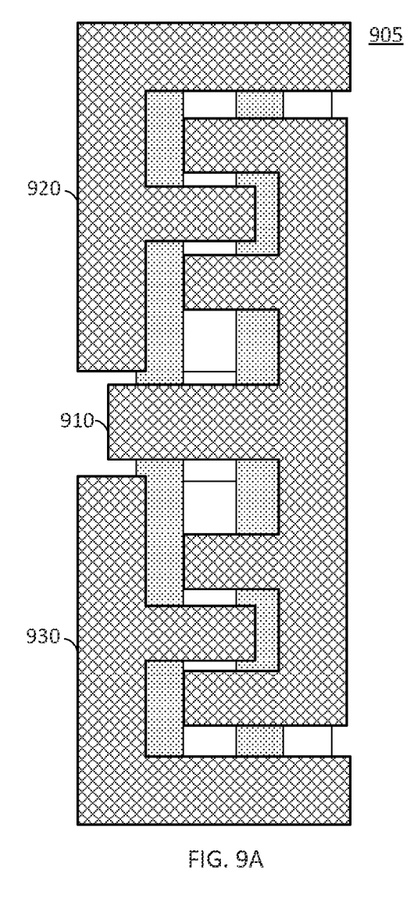
FIG. 9A shows an example of the metal-programmable cell in FIG. 8 programmed to implement two capacitors according to an embodiment of the present disclosure.

FIG. 9A shows an example in which the metal-programmable cell 805 in FIG. 8 is programmed to implement two capacitors by adding an upper metal layer. In this example, the upper metal layer is patterned to form a first metal plate 910, a second metal plate 920, and a third metal plate 930. The second metal plate 920 may be connected to Vdd of a power supply, and the third metal plate 930 may be connected to Vss of the power supply. The first metal plate 910 may be connected to the gates 210 and 810 by the fifth and eighth vias 260 and 860, the second plate 920 may be connected to the first, second and fifth source/drain regions 220, 225 and 825 by the first, second and sixth vias 230, 235 and 835, and the third metal plate 930 may be connected to the third, fourth and sixth source/drain regions 240, 245 and 845 by the third, fourth and seventh vias 250, 255 and 855.

The programmed cell 905 includes a first capacitor connected to Vdd and a second capacitor connected to Vss. The capacitance of the first capacitor includes the capacitance between the first and second metal plates 910 and 920 and gate-oxide capacitance from the gate oxides of the gates 210 and 810. The capacitance of the second capacitor includes the capacitance between the first and third metal plates 910 and 930 and gate-oxide capacitance from the gates 210 and 810. The first and second capacitors may be connected to a data path to add delay to the data path to fix a hold violation, as discussed above.

Figure 9B:
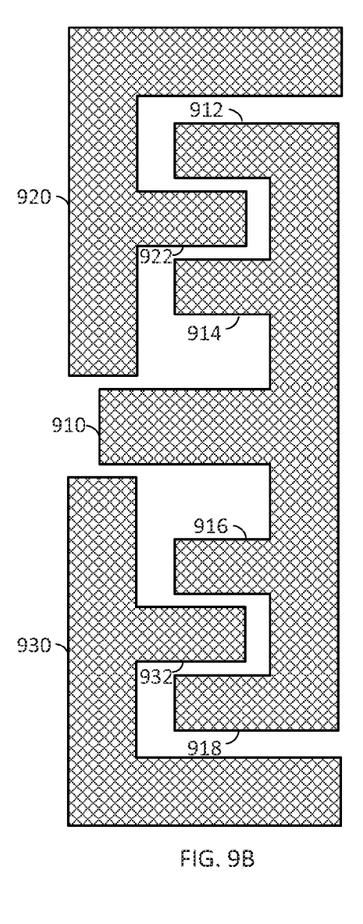
FIG. 9B shows a patterned upper metal layer used to program the metal-programmable cell in FIG. 9A.

FIG. 9B shows the first metal plate 910, second metal plate 920, and third metal plate 930 without the underlying gates and source/drain regions for ease of illustration. As shown in FIG. 9B, the first metal plate 910 may comprise a plurality of fingers 912, 914, 916 and 918. The second metal plate 920 may comprise a finger 922 between fingers 912 and 914 of the first metal plate 910, and the third metal plate 930 may comprise a finger 932 between fingers 916 and 918 of the first metal plate 910. In this example, the first and second metal plates 910 and 920 form a first finger capacitor connected to Vdd and the first and third metal plates 910 and 930 form a second finger capacitor connected to Vss.

It is to be appreciated that the finger capacitors shown in FIG. 9B are exemplary only, and that embodiments of the present disclosure are not limited to the example shown in FIG. 9B. For example, each of the first and second metal plates 910 and 920 may comprise any number of fingers, in which fingers of the first metal plate 910 are interlaced with the fingers of the second metal plate 920. Similarly, each of the first and third metal plates 910 and 930 may comprise any number of fingers, in which fingers of the first metal plate 910 are interlaced with the fingers of the third metal plate 930. The capacitance of each finger capacitor may be adjusted by adjusting the number of fingers, the spacing between the fingers and/or the dimensions (e.g., length and/or width) of the fingers. For example, capacitance may be increased by increasing the number of fingers.

Figure 10:
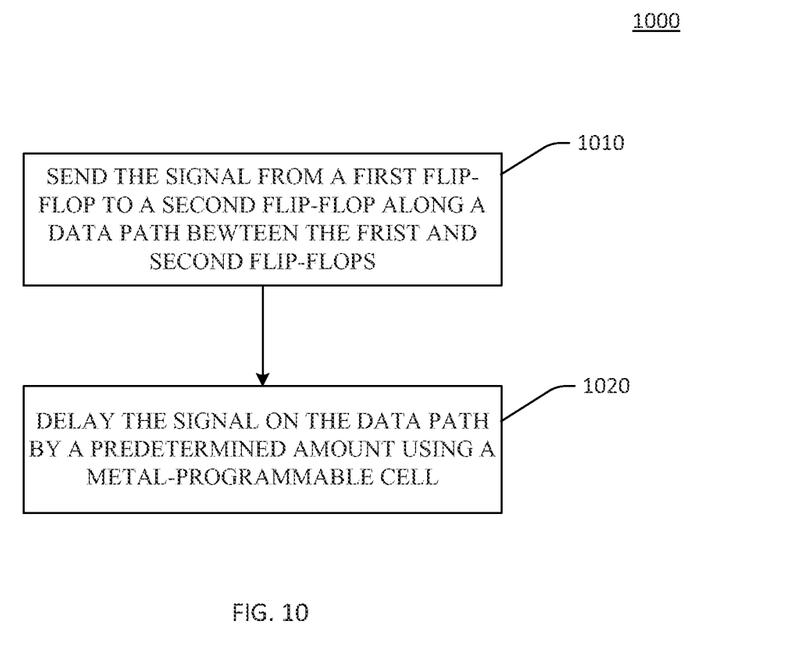
FIG. 10 is a flowchart illustrating a method for delaying a signal according to certain embodiments of the present disclosure.

FIG. 10 is a flow diagram of a method 1000 for delaying a signal in accordance with embodiments of the present disclosure. The signal may be delayed to prevent a hold violation from occurring in an apparatus (e.g., a mobile device).

In step 1010, the signal is sent from a first flip-flop to a second flip-flop along a data path between the first and second flip-flops. For example, the signal may be launched from an output of the first flip-flop (e.g., flip-flop 110) and propagate along the data path (e.g. data path 125) to an input of the second flip-flop (e.g., flip-flop 120).

In step 1020, the signal on the data path is delayed by a predetermined amount using a metal-programmable cell, wherein the metal-programmable cell is programmed to implement at least one capacitor, and the at least one capacitor adds a capacitive load to the data path that delays the signal by the predetermined amount. For example, the metal-programmable cell (e.g., metal-programmable cell 305) may comprise an upper metal layer that is patterned to form at least two metal plates that implement the at least one capacitor. The metal plates may be shaped and/or spaced apart by an amount that achieves the desired capacitive load. The metal plates may also be connected to at least one gate and at least one source/drain region of the metal-programmable cell to add gate-oxide capacitance to the at least one capacitor.

Figure 11:
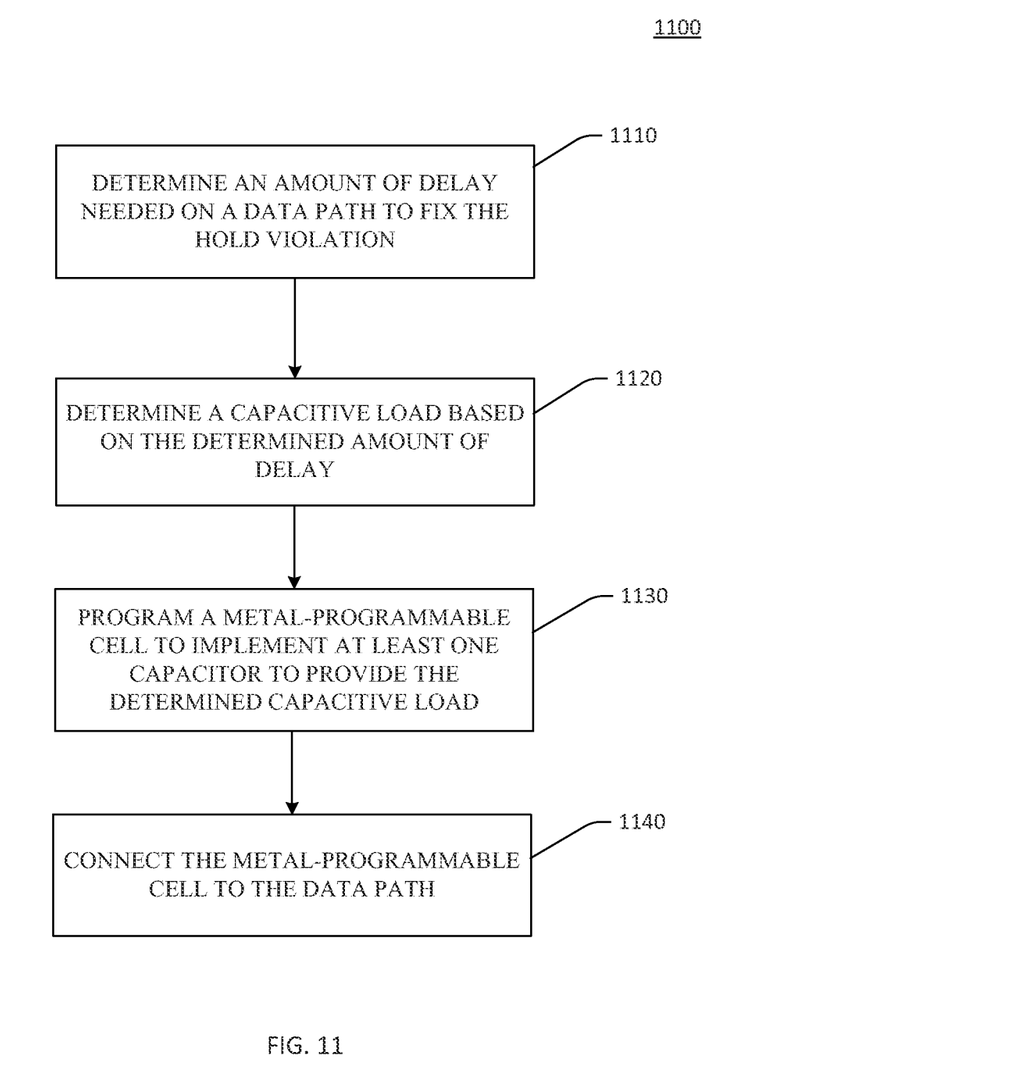
FIG. 11 is a flowchart illustrating a method for fixing a hold violation according to certain embodiments of the present disclosure.

FIG. 11 is a flow diagram of a method 1100 for fixing a hold violation in accordance with embodiments of the present disclosure. The method 1100 may be performed after a hold violation has been identified at a particular flip-flop in a circuit design. The hold violation may be identified by a timing analysis performed on the circuit to check whether timing requirements (e.g., setup-time and hold-time requirements) are met in different parts of the circuit. After the hold violation has been identified, the method 1000 may be performed to fix the hold violation.

In step 1110, an amount of delay needed on a data path to fix the hold violation is determined. For example, a timing analysis tool may be used to determine the shortest delay along the data path across process-temperature-voltage (PTV) variations, and to determine an amount of delay needed on the data path to fix the hold violation for the shortest delay. This helps ensure that the delay will be sufficient to fix the hold violation across PTV variations.

In step 1120, a capacitive load is determined based on the determined amount of delay. The capacitive load may be a capacitive load that, when connected to the data path, adds a delay to the data path approximately equal to the determined amount of delay.

In step 1130, a metal-programmable cell is programmed to implement at least one capacitor to provide the determined capacitive load. The metal-programmable cell may be programmed by adding an upper metal layer to the cell and patterning the metal layer to implement the at least one capacitor. For example, the metal layer may be patterned to form two metal plates (e.g., metal plates 310 and 320) to implement a capacitor, in which one of the metal plates forms one terminal of the capacitor and the other metal plate forms the other terminal of the capacitor. The shapes of the metal plates and/or spacing between the metal plates may be adjusted to achieve the determined capacitive load, as discussed above.

The metal plates may also connect to a gate (e.g., gate 210) and one or more source/drain regions (e.g., source/drain regions 220 and 225) of the metal-programmable cell to add gate-oxide capacitance to the capacitor. For example, one of the metal plates may be connected to the gate by forming the metal plate (e.g., 310) over a via (e.g., via 260) connected to the gate. The other metal plate may be connected to the one or more source/drain regions by forming the other metal plate over one or more vias (e.g., vias 230 and 235) connected to the one or more source/drain regions.

In step 1140, the metal-programmable cell is connected to the data path. The metal-programmable cell may be connected to the data path along any point on the data path to add the capacitive load to the data path. The capacitive load adds the determined amount of delay to the data path to prevent the hold violation, thereby fixing the hold violation.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A system, comprising:
   a first flip-flop;
   a second flip-flop;
   a data path between the first and second flip-flops; and
   a metal-programmable cell connected to the data path, wherein the metal-programmable cell is programmed to implement at least one capacitor to add a capacitive load to the data path, the metal-programmable cell comprising:
   a metal layer patterned to form a first metal plate and a second metal plate to implement the at least one capacitor; and
   a baseline structure below the metal layer, the baseline structure comprising:
   a first source/drain region;
   a second source/drain region;
   a channel region between the first and second source/drain regions;
   a gate above the channel region; and
   an oxide layer between the gate and the channel region.

2. The system of claim 1, wherein the first metal plate is connected to the gate and the second metal plate is connected to the first and second source/drain regions.

3. The system of claim 2, wherein the first metal plate is connected to the data path, and the second metal plate is connected to a power supply.

4. The system of claim 1, wherein the first metal plate comprises a plurality of fingers and the second metal plate comprises a finger between two adjacent fingers of the plurality of fingers of the first metal plate.

5. The system of claim 1, wherein the metal layer is patterned to form a third metal plate, and the baseline structure further comprises:
   third and fourth source/drain regions;
   a second channel region between the third and fourth source/drain regions;
   a second gate above the second channel region; and
   a second oxide layer between the second gate and the second channel region.

6. The system of claim 5, wherein the first metal plate is connected to the first and second gates, the second metal plate is connected to the first and second source/drain regions, and the third metal plate is connected to the third and fourth source/drain regions.

7. The system of claim 6, wherein the first metal plate is connected to the data path, the second metal plate is connected to Vdd of a power supply, and the third metal plate is connected to Vss of the power supply.

8. The system of claim 6, wherein the first and second gates are integrated into one common gate.

9. A system, comprising:
   a first flip-flop;
   a second flip-flop;
   a data path between the first and second flip-flops; and
   a metal-programmable cell connected to the data path, wherein the metal-programmable cell is programmed to implement at least one capacitor to add a capacitive load to the data path, the metal-programmable cell comprising:
   a baseline structure; and
   a metal layer above the baseline structure, wherein the metal layer is patterned to form a first metal plate, a second metal plate and a third metal plate to implement the at least one capacitor, the first metal plate is connected to the data path, the second metal plate is connected to Vdd of a power supply, and the third metal plate is connected to Vss of the power supply.

10. A method for delaying a signal, the method comprising:
    sending the signal from a first flip-flop to a second flip-flop along a data path between the first and second flip-flops; and
    delaying the signal on the data path by a predetermined amount using a metal-programmable cell, wherein the metal-programmable cell is programmed to implement at least one capacitor, and the at least one capacitor adds a capacitive load to the data path that delays the signal by the predetermined amount, the metal-programmable cell comprising:
    a metal layer patterned to form a first metal plate and a second metal plate to implement the at least one capacitor; and
    a baseline structure below the metal layer, the baseline structure comprising:
    a first source/drain region;
    a second source/drain region;
    a channel region between the first and second source/drain regions;
    a gate above the channel region; and
    an oxide layer between the gate and the channel region.

11. The method of claim 10, wherein the first metal plate is connected to the gate and the second metal plate is connected to the first and second source/drain regions.

12. An apparatus for delaying a signal, the apparatus comprising:
    means for sending the signal from a first flip-flop to a second flip-flop along a data path between the first and second flip-flops; and
    means for delaying the signal on the data path by a predetermined amount by adding a capacitive load to the data path that delays the signal by the predetermined amount, the means for delaying comprising:
    a metal layer patterned to form a first metal plate and a second metal plate to implement at least one capacitor; and
    a baseline structure below the metal layer, the baseline structure comprising:
    a first source/drain region;
    a second source/drain region;
    a channel region between the first and second source/drain regions;
    a gate above the channel region; and
    an oxide layer between the gate and the channel region.

13. The apparatus of claim 12, wherein the first metal plate is connected to the gate and the second metal plate is connected to the first and second source/drain regions.

* * * * *